United States Patent
Appelt et al.

(10) Patent No.: US 6,684,497 B2
(45) Date of Patent: Feb. 3, 2004

(54) MANUFACTURING METHODS FOR PRINTED CIRCUIT BOARDS

(75) Inventors: Bernd Karl-Heinz Appelt, Apalachin, NY (US); James Russell Bupp, Endwell, NY (US); Donald Seton Farquhar, Endicott, NY (US); Ross William Keesler, Endicott, NY (US); Michael Joseph Klodowski, Endicott, NY (US); Andrew Michael Seman, Kirkwood, NY (US); Gary Lee Schild, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 09/789,156

(22) Filed: Feb. 20, 2001

(65) Prior Publication Data

US 2001/0032828 A1 Oct. 25, 2001

Related U.S. Application Data

(62) Division of application No. 08/968,988, filed on Nov. 12, 1997, now Pat. No. 6,222,136.

(51) Int. Cl.$^7$ .............................. H01K 3/10; H05K 3/36; H05K 3/20; H05K 3/30
(52) U.S. Cl. ............................ 29/852; 29/830; 29/831; 29/841; 29/846
(58) Field of Search .................. 29/852, 830, 831, 29/841, 846; 216/48, 20, 105; 430/313, 318

(56) References Cited

U.S. PATENT DOCUMENTS

| | | | |
|---|---|---|---|
| 3,767,398 A | | 10/1973 | Morgan |
| 3,960,561 A | | 6/1976 | Haining et al. |
| 4,209,355 A | | 6/1980 | Burns |
| 4,372,804 A | | 2/1983 | Hanabusa et al. |
| 4,914,056 A | * | 4/1990 | Okumura .................... 438/629 |
| 4,983,252 A | | 1/1991 | Masui et al. |
| 5,092,032 A | | 3/1992 | Murakami |
| 5,200,026 A | * | 4/1993 | Okabe .......................... 216/48 |
| 5,294,519 A | * | 3/1994 | Mori et al. .................. 430/313 |
| 5,377,406 A | * | 1/1995 | Matsumoto et al. .......... 216/20 |
| 5,492,233 A | | 2/1996 | Kusagaya |

* cited by examiner

Primary Examiner—Carl J. Arbes
Assistant Examiner—Thiem Dinh Phan
(74) Attorney, Agent, or Firm—Patrick J. Daugherty

(57) ABSTRACT

A method of forming a printed circuit board comprising a plurality of conductive bumps with substantially coplanar upper surfaces. The method comprises the steps of applying a metal layer onto a dielectric substrate; applying a first photoresist onto said substrate and exposing and developing said first photoresist to define a pattern of conductive bumps; etching the metal layer exposed by said development to form said plurality of conductive bumps; removing said first photoresist; applying a second photoresist onto the metal layer; exposing and developing said second photoresist to define a pattern of conductive bumps and circuit lines; etching the metal layer exposed by said development to form a pattern of circuit lines in said metal layer; and removing said second photoresist. The present invention is also provides a method for preparing a reinforced panel.

14 Claims, 11 Drawing Sheets

MANUFACTURING METHODS FOR PRINTED CIRCUIT BOARDS

RELATED U.S. APPLICATION DATA

This application is a division of the Nov. 12, 1997 filing data of U.S. application Ser. No. 08/968,988, now U.S. Pat. No. 6,222,136.

FIELD OF THE INVENTION

This invention relates to methods of manufacturing printed circuit boards, particularly printed circuit boards having substantially coplanar conductive bumps on the surface thereof and to printed circuit boards having solid interconnects between the conductive layers thereof

BACKGROUND OF THE INVENTION

Standard flexible printed circuit boards comprise a flexible dielectric substrate having circuit lines attached to one or more surfaces thereof. Typically, electrical connections are made between such printed circuit boards and other electrically conductive components by means of conductive bumps which are in electrical communication with the circuit lines. Usually, the conductive bumps are formed by electroless or electrolytically plating the bumps on one or more surfaces of the printed circuit board. The resulting bumps may be polished to provide a plurality of bumps whose top surfaces are intended to be substantially coplanar.

In certain applications it is necessary that the printed circuit boards have a large number of conductive bumps on the surface thereof. Moreover, it is necessary that a large number, if not all, of the bumps extend to essentially the same distance above the surface of the printed circuit board, i.e., that the conductive bumps have substantially coplanar upper surfaces. Unfortunately, the standard methods that are used to form bumps on a printed circuit board do not easily meet these requirements.

Typically, flexible printed circuit boards are fabricated in a continuous roll process to facilitate handling of the thin materials that are used to form such boards. The steps required to fabricate a two conductor layer flexible cable, such as metallizing the dielectric, circuitizing the metal and holemaking can all be performed on flexible substrates in roll form. Although roll processing is suitable for materials that have good mechanical strength and tear resistance, such as polyimides, roll processing is not suitable for Teflon-based materials, which typically have better electrical characteristics than polyimides but poorer mechanical properties. Roll processing is also not suitable for the manufacture of the very thin, low dielectric polymers that typically lack the continuous glass fiber reinforcement of rigid printed circuit boards. Furthermore, roll processing is not readily adaptable to fabricating cables with multiple conductive layers where lamination of additional dielectric layers would be required. Thus, when three or more conductive layers are required in the flexible cable or a circuit board, the required lamination step can be more readily accomplished by employing panel form processing as opposed to continuous roll processing.

In panel form processing the partially completed circuit board is conveyed horizontally on rollers or mounted in a frame for vertical processing. During processing, the circuit board is subjected to stretching which can cause damage, such as tearing or wrinkling of the thin panel. Furthermore, the panels tend to shrink or grow as they go through various thermal excursions, or etching, or plating of copper, or addition of dielectric layers. Since the final product has precise dimensional requirements and requires precise layer to layer alignment, this change in size is problematic. Accordingly, special steps must be taken to prevent damage of flexible cables during fabrication which often offsets the performance advantages of these products with large cost penalties. Thus, panel processing is not well suited to the fabrication of thin flexible cables or thin circuit boards.

In multi-layer printed circuit boards, i.e., circuit boards comprising at least two conductive layers and two dielectric layers, it may be necessary to interconnect the conductive layers on the opposing surfaces of at least one of the dielectric layers. Conventionally, the inter-layer connections between such conductive layers are made by drilling a hole through the conductive layers and the dielectric substrate and plating the resulting via with metal. Since each hole must be drilled individually, this process is time-consuming and expensive. Moreover, the practical minimum size of the holes that are normally produced by such mechanical drilling processes are between 4 to 10 mils. For high performance circuit boards it would be desirable to have hole sizes as small as 2 mils in diameter or even 1 mil.

An alternative approach to forming interconnections between the conductive layers of a multi-layer printed circuit board is to use partial depth or blind vias that are made in the dielectric substrate only. Again the vias are plated to connect the conductive layers that are subsequently formed on opposing surfaces of the substrate. Blind vias can be made by conventional mechanical drilling, or alternatively by laser ablation, by plasma etching, or by photolithography if the dielectric material is photoimageable. Blind vias make more efficient use of space than through vias because additional circuit elements can be included along their axis. Nonetheless, the blind vias can be very difficult to clean and plate because process fluids cannot flow through the smaller hole. As a result, the process fluids tend to get trapped in the vias. Flux and solder also tend to collect in the holes during later processing steps. The accumulation of flux and solder in the vias ultimately can lead to failure of the resulting printed circuit board. For this reason, a variety of methods have been proposed to provide some method of filling the vias after they are plated with various types of materials, both conductive and non-conductive, as a means to provide a planar surface to the printed circuit boards that is not inclined to trap process fluids or materials. However, such hole filling methods tend to add additional processing and material costs to the fabrication of a printed circuit board.

Accordingly, it is desirable to have new methods for forming printed circuit boards, including multi-layer printed circuit boards, that overcome these disadvantages. A method which simultaneously produces a plurality of solid conductive bumps that can be used as interconnectors between the conductive layers on opposing surfaces of a dielectric substrate is desirable. A method that produces a plurality of conductive bumps whose upper surfaces are substantially coplanar is especially desirable A method that provides rigidity and dimensional stability to the flexible or thin printed circuit boards, especially during the early stages of processing, is also desirable.

SUMMARY OF THE INVENTION

In accordance with the present invention, a printed circuit board comprising a plurality of conductive bumps whose upper surfaces extend to essentially the same height above the surface of a dielectric substrate is provided. The printed circuit board is made by a process comprising the steps of: forming a substantially planar metallic layer having a first thickness on at least one surface of the dielectric; applying a first photoresist on the metal layer; imaging the first photoresist to define a predetermined pattern of conductive bumps; etching the exposed portions of the metal layer to a second thickness to form the conductive bumps; removing the first photoresist; applying a second photoresist to the metal layer; imaging the second photoresist to define a predetermined pattern of circuitry; etching the exposed portions of the metal layer to provide the electrical circuitry; and removing the second photoresist to provide a printed circuit board having a plurality of conductive bumps that extend to essentially the same height above the surface of the dielectric. Based on the measurements of more than 11,000 conductive bumps formed in accordance with the present invention it has been determined that the coefficient of variation (i.e., the standard deviation divided by the mean) in the height of the bumps above the surface of the substrate is 4% This value corresponds to a bump height coplanarity of +/−1.5 microns. Such bumps are hereinafter referred to as "substantially coplanar conductive bumps."

In a preferred embodiment, the first etching step comprises one or more treatments with an etching agent at a temperature below 110° F. The preferred etching agent comprises cupric chloride in an aqueous hydrochloric acid solution. It has been determined that such etching results in less thinning at the base of the conductive bumps than conventional etching processes which typically employ temperatures of greater than 120° F. and other etchants.

The present invention also provides a method for preparing printed circuit boards, particularly multi-layer printed circuit boards, wherein two conductive layers that are disposed on opposing sides of a dielectric layer are interconnected by at least one of the substantially coplanar conductive bumps. The method of forming such multi-layered printed circuit boards comprises the additional steps of depositing a second dielectric layer on the substantially coplanar conductive bumps and circuitry; exposing the upper surface of at least one of the conductive bumps; and depositing a second metal layer on the second dielectric layer and the exposed upper surface of the conductive bump.

The present invention is also related to a method for increasing the rigidity of a multi-layer structure that is used to form a flexible printed circuit board. The method comprises the steps of: applying a metal layer having a first height on at least one surface of a dielectric substrate; applying a first photoresist to the metal layer, imaging the photoresist to provide at least one section of remaining photoresist defining an opening therein and at least one exposed region of the metal layer; etching the exposed region of the metal layer to a second height; and removing the remaining photoresist to provide a multi-layered structure comprising a dielectric layer and a metal layer comprising at least one region having a second height and at least one region having a first height. The region having the second height is the basis for the electrical circuitry that is formed during subsequent manufacturing steps. Preferably, the region having the first height, hereinafter referred to as a "border", surrounds the region having the second height. The border reinforces the multi-layer structure during subsequent manufacturing steps, thus rendering the multi-layer structure easier to handle.

BRIEF DESCRIPTION OF THE DRAWINGS

The present invention may be more readily understood by reference to the drawings wherein.

DETAILED DESCRIPTION

In accordance with the present invention, a conductive layer comprising a plurality of conductive bumps, a plurality of electrically conductive circuit lines, and a plurality of contact pads is subtractively formed from a single substantially planar layer of metal that has been disposed on a surface of a dielectric layer. Because the lines, pads and bumps are all formed from a single metallic layer, the bumps, pads, and lines are electrically connected and continuous. As used herein the term "continuous" means that there are no interfaces between the conductive bumps, the contact pads, and the circuit lines. In one embodiment, a first metal layer, preferably a substantially planar metal layer, having a first height (x) is disposed on at least one surface of the dielectric substrate through plating or, preferably, through lamination of a metal foil to the substrate. A first photoresist is then applied to the exposed surface of the first metal layer. The first photoresist is imaged, i.e., exposed through a mask, and the exposed portions developed to form a pattern of remaining photoresist which corresponds to the desired pattern of conductive bumps. The exposed portions of the metal layer are then partially etched to a second height (y) which is substantially equal to the desired height of the circuitry. This first etching step forms the conductive bumps, which are dispersed in the metal layer in a predetermined pattern. Then a second photoresist is applied, preferably after the first photoresist is removed, onto the exposed surfaces of the conductive bumps and the etched surface of the metal layer. The second photoresist is then imaged to provide a pattern of remaining photoresist which corresponds to the desired pattern of conductive bumps and the desired pattern of the contact pads and electrical circuitry. The metal covered by the resist has a first height and a second height. The metal having the first height forms the conductive bumps. The metal having the second height is the starting material for the electrical circuitry and contact pads. The uncovered portions of the metal are then etched along the remaining resist and the remaining resist removed. This process results in the formation of a printed circuit board comprising a layer of dielectric substrate, a layer of electrical circuitry disposed on a first surface of the substrate and a plurality of substantially coplanar conductive bumps disposed on the first surface of the substrate and continuous with the contact pads and electrical circuitry.

Figure 1A:
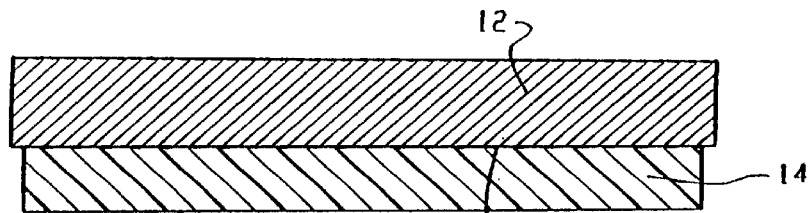
FIGS. 1(a) through (e) illustrate the process steps for forming a plurality of substantially coplanar conductive bumps on the surface of a printed circuit board.

The steps of one embodiment of the present method are illustrated in FIGS. 1(a) through 1(e). As shown in FIG. 1(a)

a substantially planar metal layer 12 is applied to at least one opposing face 18 of a dielectric substrate 14. Preferably, the metal layer is a copper layer. Preferably the metal layer has a thickness of from about 14 μm to about 105 μm, more preferably from about 35 μm to about 70 μm. Although any standard technique such as evaporation, sputtering, electrolytic or electroless plating, among others, may be used to apply the metal layer to the dielectric substrate, it is preferred that the metal layer be applied by laminating a metallic foil having a substantially uniform thickness to the substrate. Typically, such metallic foils are uniform in thickness to a tolerance of ±1 micron. Optionally, to make the panel more rigid a metal layer may also be applied to the opposing face 20 of dielectric substrate 14. This second metal layer can also be used for forming bumps on opposing face 20. Then a first photoresist 22 is applied to the exposed surfaces of each metal layer. Suitable photoresists include negative photoresists, such as for example, McDermid Aquamer CFI or MI, du Pont Riston 9000, or du Pont Riston 4700. Application of the photoresist is usually made with a hot roll laminator or by lamination on a cut sheet laminator.

Figure 1B:
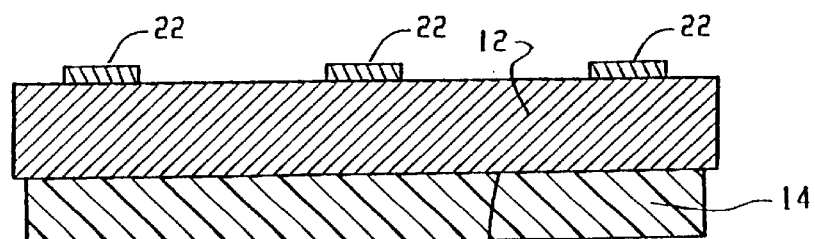

The first photoresist is then exposed through a mask and developed to remove portions thereof and to provide a pattern of remaining photoresist sections (22) dispersed on top of metal layer 12 as shown in FIG. 1(b). The position and shape of these sections correspond to the desired location and shape of the intended conductive bumps. Preferably, the width and length of these sections are slightly larger, preferably from about 1 to 4 mils larger, than the desired width and length of the intended conductive bumps to account for undercut by the etch process. This photolithographic process exposes the portions of the copper layer from which the circuit lines are to be formed.

Figure 1C:
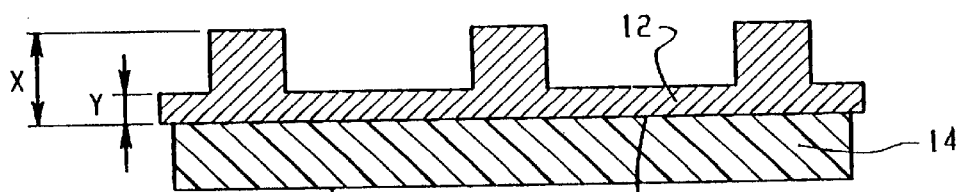
Figure 1D:
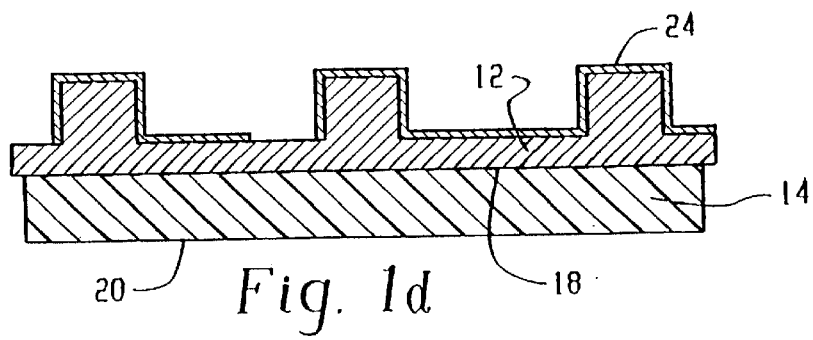

The exposed portions of the copper layer are then partially etched to a second height (y) as shown in FIG. 1(c). Preferably, the exposed copper layer is etched to a height of about 1 mil preferably, by subjecting the exposed surface of the copper layer to treatment with an etching agent comprising cupric chloride in an aqueous hydrochloric acid solution at a temperature below 110° F., preferably at a temperature between 75° F. and 100° F., more preferably at a temperature between 90° and 92° F. Preferably the etching agent comprises cupric ions at a concentration of from about 125 to 225 gm/liter, i.e, from about 1.9 to about 3.5 M, more preferably from about 150 to about 200 gm/liter of etching agent. Preferably, the concentration of hydrochloric acid in the etching agent is from about 1 to 2 N. Alternate etchants such as ferric chloride or sodium persulphate can also be used for low temperature etching of the bumps. The exposed portions of the copper layer are treated with the etching agent for a time sufficient to reduce the height of the exposed portions of the metal layer to the desired second height. The etching may be performed by dipping the metallized substrate in the etching agent or, preferably, by spraying the top surface thereof with the etching agent. It has been determined that the preferred etching process minimizes the undercutting of the conductive bumps that come into contact with the etching agent and provides the control needed to prevent thinning of the exposed portions of the copper layer beyond the desired second height. To permit monitoring of the reduction in height of the exposed copper layer, it is preferred that the multiple treatments be used. Preferably each treatment is less than one minute and the orientation of the panel is varied to improve uniformity of etching. Optimal process conditions can be determined using standard engineering experimental methods.

Figure 1E:
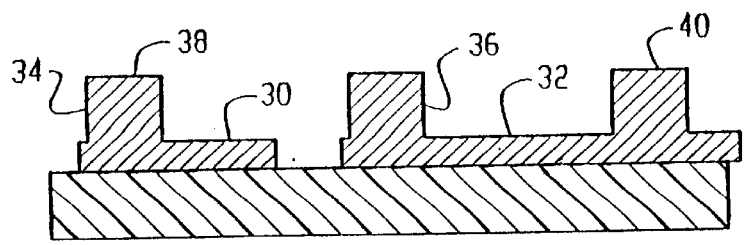

Once the exposed portions of the metal layer are etched to the desired second height the remaining sections of the first photoresist are preferably removed, preferably by a chemical stripping process. Then a second photoresist 24 is applied, preferably by using conventional electrodeposition procedures, onto the exposed surface of the metal layer. Second photoresist 24 is imaged, i.e., exposed through a mask, and developed to provide a pattern of remaining second photoresist sections covering intended conductive bumps and the intended copper circuitry (FIG. 1(d)). Examples of a commercially available second photoresists include, but are not limited to, the positive electrodepositable photoresists Shipley PEPR 2400 and Nippon P2000. The exposed portions of the metal layer are then etched along the remaining resist. This second etching step may involve wet etching in which the exposed copper layer is treated with an etching agent such as cupric chloride. Then remaining second resist is removed by conventional procedures, such as by treating with a sodium hydroxide solution or commercial strippers such as DuPont Riston S 1100X stripper, to provide a printed circuit board comprising a dielectric substrate, a plurality of substantially coplanar conductive bumps disposed on a surface of the substrate, and a plurality of circuit lines disposed on the surface of the dielectric substrate. As shown in FIG. 1(e), circuit lines 30 and 32 are in electrical communication with and continuous with conductive bumps 34 and 36, respectively. Optionally, the lines or bumps can be subsequently augmented with additional metal layers of either the same metal or a different metal.

Optionally, a second dielectric is then applied to the exposed surfaces of the circuit lines using techniques known in the art to provide a structure in which the upper surfaces 38 and 40 of the coplanar conductive bumps 34 and 36 are even with or, preferably, protrude above the surface of the dielectric. Following application of the second dielectric, the exposed top and side surfaces of the bumps may be treated with an organic surface preservative such as Entek Plus from Enthone. The resulting circuit boards are useful for forming solderable connections. Alternatively, a metal finish such as nickel, gold, or palladium may be applied to the upper surfaces of the conductive bumps that are even with or protrude above the surface of the second dielectric. Preferably, the metal finishes are applied by the process of electroless plating. Such structures are useful for wire bonding the printed circuit board to a semiconductor chip.

Figure 2A:
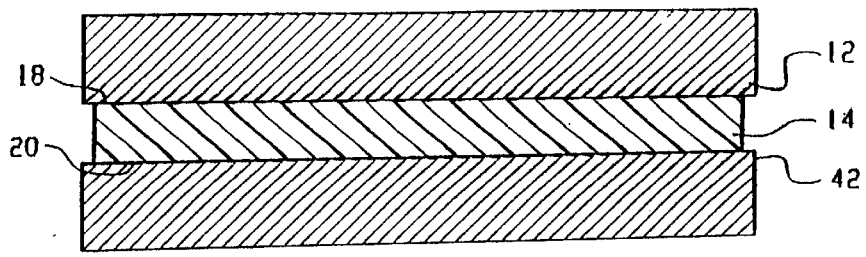
FIGS. 2(a) through 2(l) illustrate the process steps for forming a plurality of substantially coplanar conductive bumps on the surface of a printed circuit board comprising two conductive layers that are connected by plated through holes.
Figure 2B:
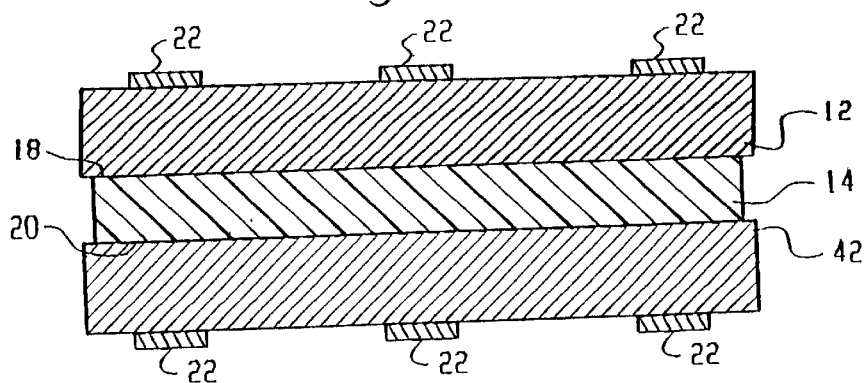
Figure 2C:
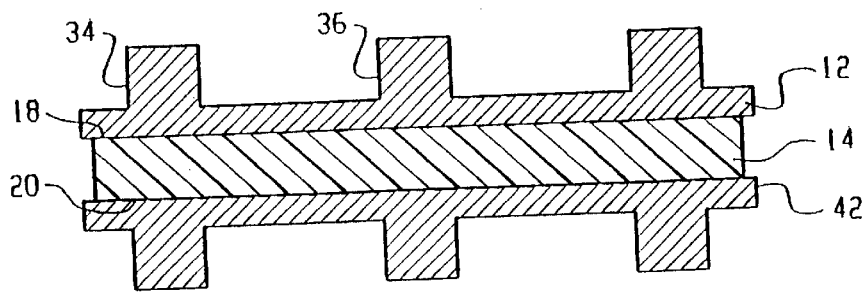
Figure 2D:
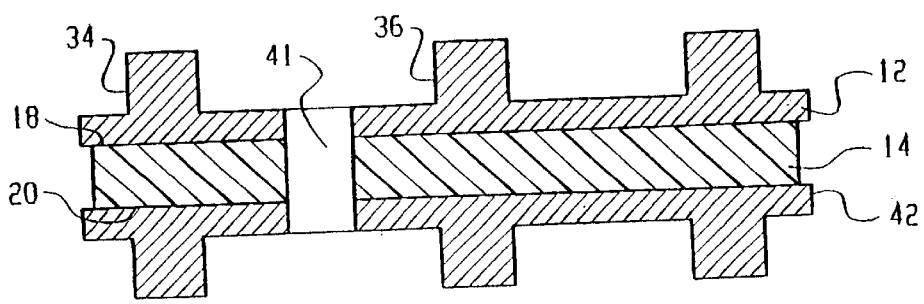
Figure 2E:
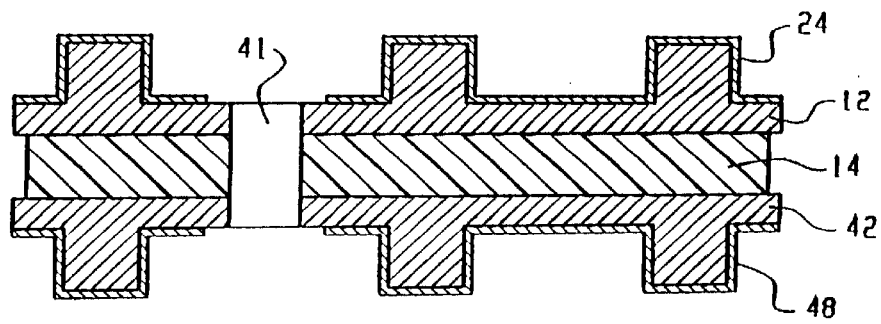

In another embodiment, metal layers 12 and 42 are applied to both opposing surfaces 18 and 20, respectively, of substrate 14 and interconnected using plated through-holes. The steps of this embodiment are shown in FIGS. 2(a)–2(i). Steps depicted in FIGS. 2(a) through 2(c) are the same as the steps depicted in FIGS. 1(a) through 1(c) and will not be further discussed here. Following the first etching step and removal of the first photoresist, at least one, preferably, a plurality of through holes are formed at desired locations. The through-holes are formed, preferably, by drilling through both metallic layers 12 and 42 and substrate 14. One such through-hole 41 is shown in FIG. 2(d). The through-holes are then cleaned using standard procedures known in the art. The through-holes are then metallized, preferably by one of the following two methods.

Figure 2F:
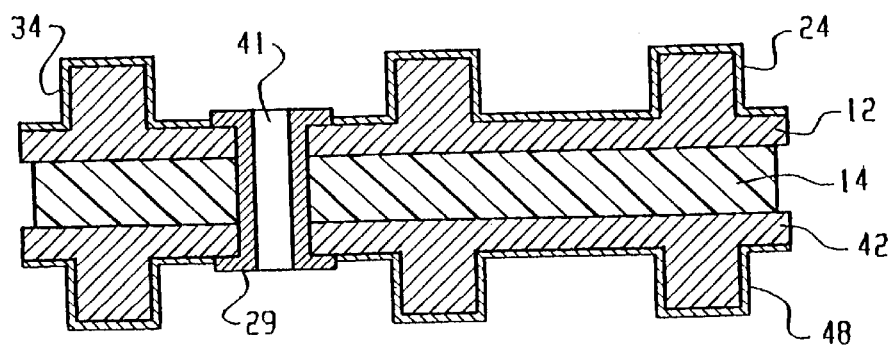
Figure 2G:
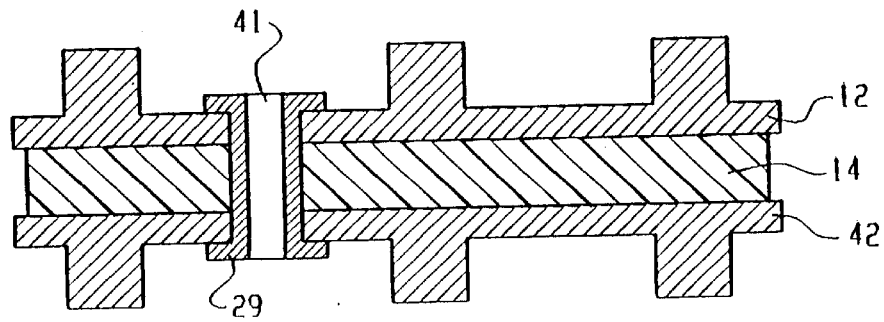

The first method uses a photolithographic process and a plating process so as to only deposit copper in the holes. After the through-holes are drilled and cleaned, the entire circuit board is treated with a colloidal seed (not shown) and then electrolessly plated with a thin metal layer (not shown). Then, photoresists 24 and 48 are applied to the metal layers 12 and 42, and exposed and developed in a pattern that exposes through-hole 41 and a small region around the top and bottom of the hole (extending 1 to 3 mils beyond the hole) (FIG. 2(e)). Then, an electrolytic plating step is used to deposit copper 29 in the through hole and in the region above and below the hole as shown in FIG. 2(f). Finally the photoresist is removed resulting in the structure depicted in FIG. 2(g).

Figure 2H:
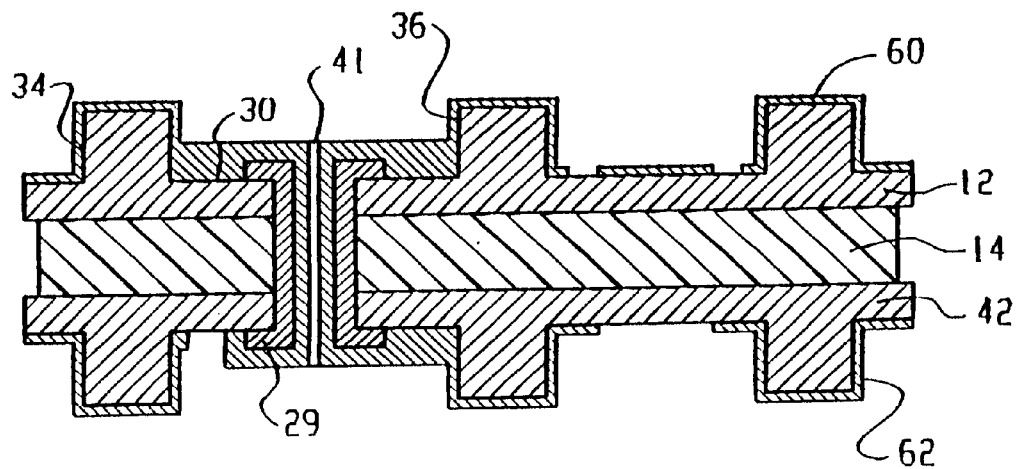
Figure 2I:
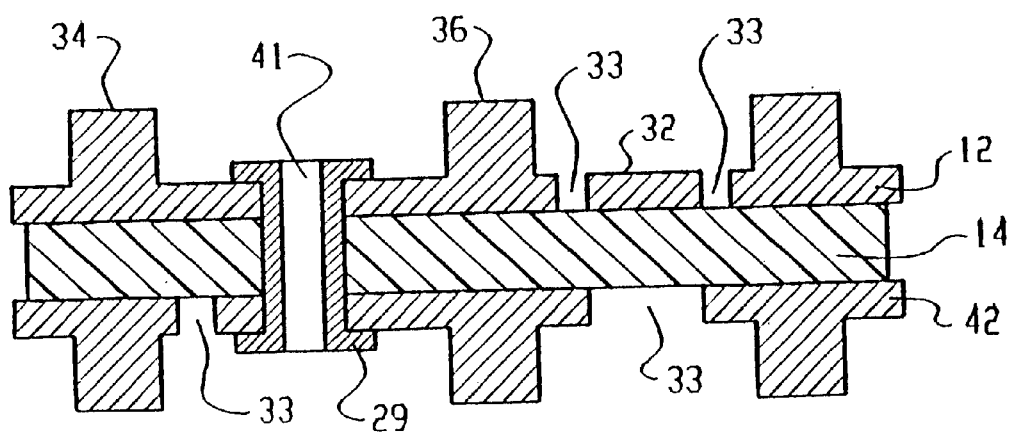

Thereafter, circuitization of the metal layer is accomplished as follows. Third photoresists 60 and 62 are applied to the exposed surface of the metal layers, preferably by electrodeposition. Third photoresist 60 is imaged to provide a pattern of remaining third photoresist sections corresponding to a plurality of conductive bumps, a plurality of circuit lines, and the plated through-hole 41 as shown in FIG. 2(h). Third photoresist 62 may also be imaged to provide a pattern of remaining sections that cover metal layers corresponding to a plurality of conductive bumps, a plurality of circuit lines, and a plurality of plated through-holes. The exposed portions of metal layers 12 and 42, are then etched in the regions where they are not covered by the photoresists 60 and 62. Then the remaining portions of third resists 60 and 62 are removed by conventional procedures to provide a printed circuit board as shown in FIG. 2(i). The printed circuit board shown in FIG. 2(i) comprises two conductive layers, wherein at least one layer comprises a plurality of substantially coplanar bumps, electrically connected to and continuous with a plurality of circuit lines that are separated by spaces 33, and wherein the conductive layers are interconnect by a plated through hole 41.

Figure 2J:
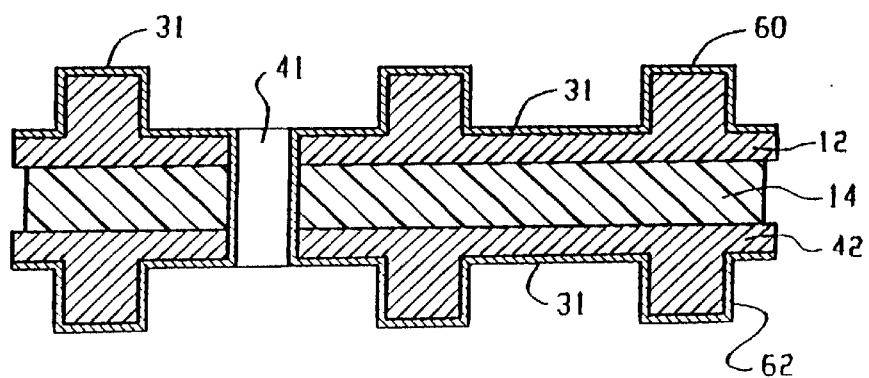

The second method for metallizing the holes is accomplished by electroplating the entire printed circuit board with a conductive metal, preferably copper. Standard printed circuit board fabrication techniques to perform electroplating include steps to clean the through holes either chemically, mechanically, or with a plasma gas. Then a colloidal seed is applied (not shown) to the entire circuit board, including the through holes. Thereafter a thin layer of copper is plated using an electroless process (not shown), and finally an electrolytic process is used to plate copper 31 over the entire surface as shown in FIG. 2(j), with a final thickness of from about 5 to 25 microns.

Figure 2K:
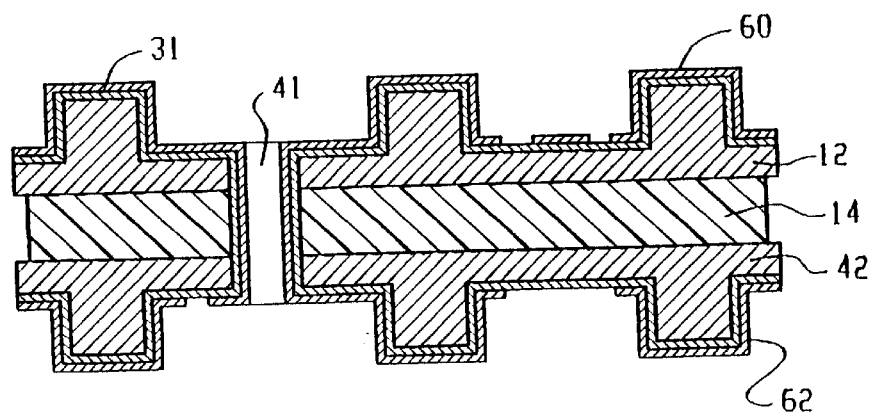
Figure 2L:
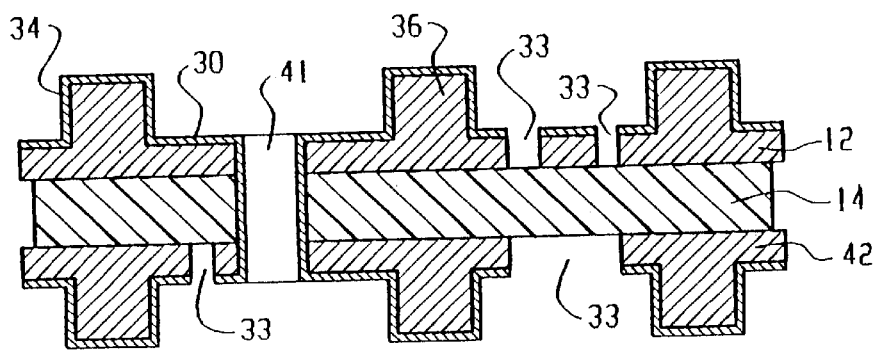

Circuitization can be now be accomplished by a method which is similar to that described for the first method of hole plating. Third photoresists 60 and 62 are applied to the exposed surface of the metal layers, preferably by electrodeposition: Third photoresist 60 is imaged to provide a pattern of remaining third photoresist sections corresponding to a plurality of conductive bumps, a plurality of circuit lines, and the plated through-hole as shown in FIG. 2(k). Third photoresist 62 may also be imaged to provide a pattern of remaining sections that cover metal layers corresponding to a plurality of conductive bumps, a plurality of circuit lines, and the plated through-holes. The exposed portions of metal layers 12 and 42 are then etched in the regions where they are not covered by the photoresists 60 and 62. Then the remaining portions of the third resists 60 and 62 are removed by conventional procedures to provide a printed circuit board as shown in FIG. 2(l). The printed circuit board comprises two conductive layers, wherein at least one layer comprises a plurality of substantially coplanar bumps, electrically connected to and continuous with a plurality of circuit lines 30 and 32 which are separated by spaces 33, and wherein the conductive layers are interconnect by a plated through hole 41. The circuit boards shown in FIGS. 2(i) and 2(l) are substantially similar, although the hole metallization processes to form the holes are different.

In another aspect, the present invention also provides a method of forming a multi-layered printed circuit board, i.e., the printed circuit board comprises at least two dielectric layers and at least two conductive layers interconnected by a least one, preferably a plurality, of solid conductive bumps. In accordance with this method, a first conductive metal layer, preferably a substantially planar conductive layer, is formed on at least one surface of a first dielectric substrate through lamination or plating. A first photoresist is then applied atop the metal layer. The first photoresist is imaged, i.e., exposed, and developed to form a pattern of remaining photoresist which corresponds to a desired pattern of conductive bumps. The exposed metal layer is then partially etched to a second height which is substantially equal to the desired height of the electrical circuitry. This first etching step forms a plurality of conductive bumps which are dispersed in the metal layer in a predetermined pattern. After the first photoresist is removed from the structure, a second photoresist is applied, preferably by electrodeposition, onto the exposed surfaces of the conductive bumps and the exposed surface of the other portions of the metal layer. The second photoresist is then imaged to provide a pattern which corresponds to the desired pattern of conductive bumps and the desired pattern of electrical circuitry. The uncovered portions of the metal are then etched along the remaining resist and the remaining resist removed. Thereafter, a second dielectric layer, is applied to the exposed surfaces of the conductive bumps, the circuit lines, and to those regions of the first dielectric layer top surface that are uncovered by removal of the second resist. At least one opening is made in the second dielectric layer, either before or after application of the second dielectric layer is applied to expose the upper surface of at least one, preferably a plurality of conductive bumps. Then a second conductive layer is deposited onto the exposed top surface of the second dielectric and to the top surface of the conductive bump to provide a multilayered circuit board in which the two conductive layers that lie on opposing surfaces of at least one dielectric substrate are interconnected by at least one solid, conductive bump. The processing steps may be repeated multiple times to add additional layers of circuitry to the printed circuit board.

Figure 3A:
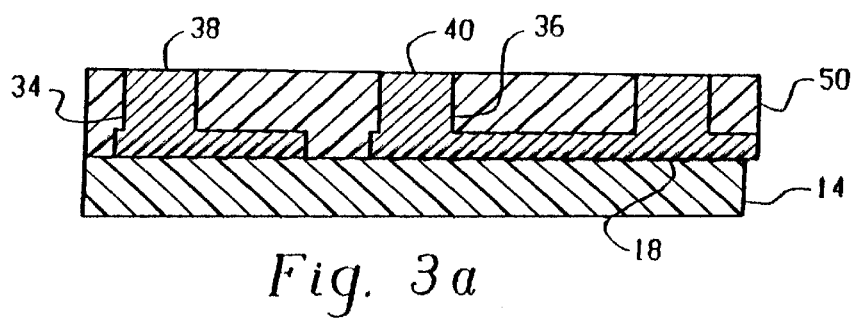
FIGS. 3(a) through 3(f) illustrate the process steps for forming a multi-layered circuit board in which at least two of the conductive layers are interconnected by a solid conductive bump.

The initial steps of this embodiment are identical to steps 1(a) through 1(e) and will not be further discussed or illustrated here. The remaining steps of this embodiment are depicted in FIGS. 3(a) through 3(e). Following formation of the structure depicted in FIG. 1(e), a dielectric material is applied to the circuit lines and the exposed regions of the first dielectric layer to form a second dielectric layer 50 as shown in FIG. 3(a). Depending on the process used to expose the upper surfaces of the conductive bumps, the dielectric material may also be disposed on the upper surfaces thereof. For example, the dielectric material may be a photoimageable organic dielectric that is subsequently photoimaged to expose the upper surfaces 38 and 40 of the conductive bumps 34 and 36. Such photoimageable materials may be applied as a liquid coating or as a film which is laminated to the exposed surfaces of the conductive bumps as well as to the exposed surfaces of the circuit lines and exposed face 18 of first dielectric layer 14. The dielectric material may then be photoimaged using standard photolithographic procedures to expose the upper surfaces of the conductive bumps that will subsequently form the solid interconnects. The dielectric material may also be removed from upper surfaces 38 and 40 of conductive bumps 34 and 36, respectively, by techniques such as plasma or laser etching or by mechanical techniques such as polishing. Alternatively, the second dielectric layer may be a thermoplastic or thermoset dielectric that is predrilled in a pattern corresponding to the pattern formed by conductive bumps 34 and 36. Such predrilled dielectrics are then aligned with the conductive bumps and brought into contact with the exposed surface of the circuit lines and the exposed regions of the top face 18 of the first dielectric substrate 14. Suitable dielectric materials that can be predrilled and applied in this manner include for example the silica-filled PTFE material RO2800, which is available from Rogers Corporation, and a PTFE-cyanate ester blend called Speedboard C available from W. L. Gore and Associates.

Figure 3B:
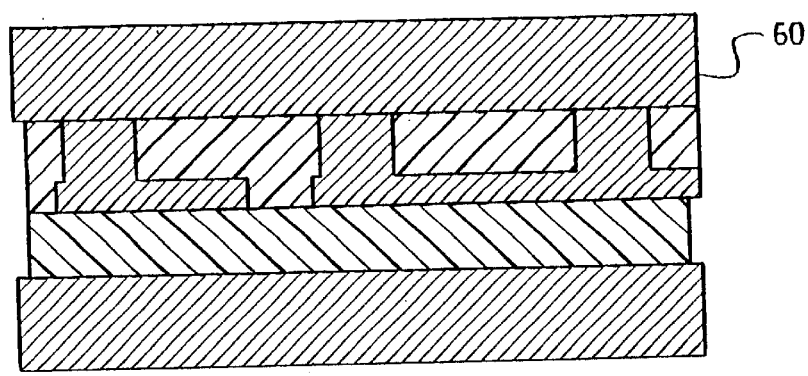
Figure 3C:
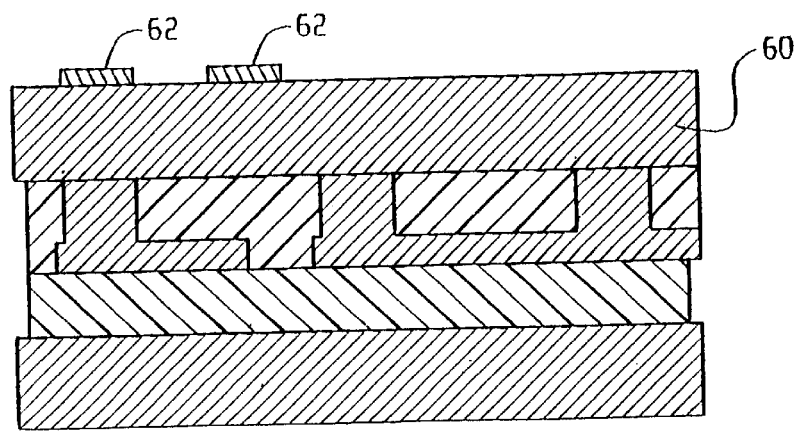
Figure 3D:
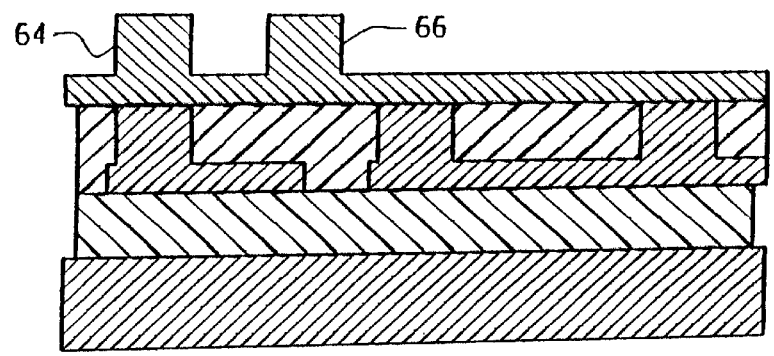
Figure 3E:
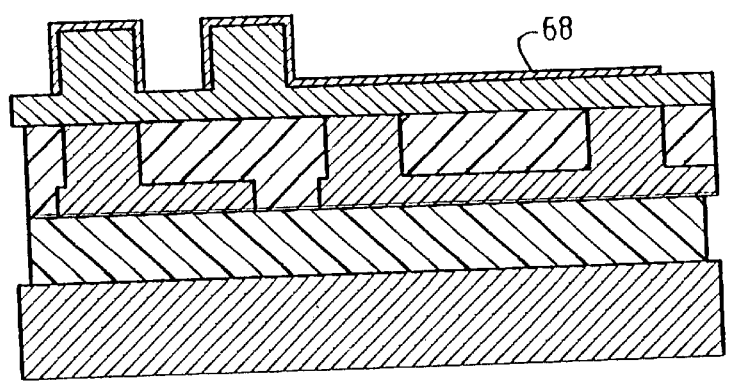
Figure 3F:
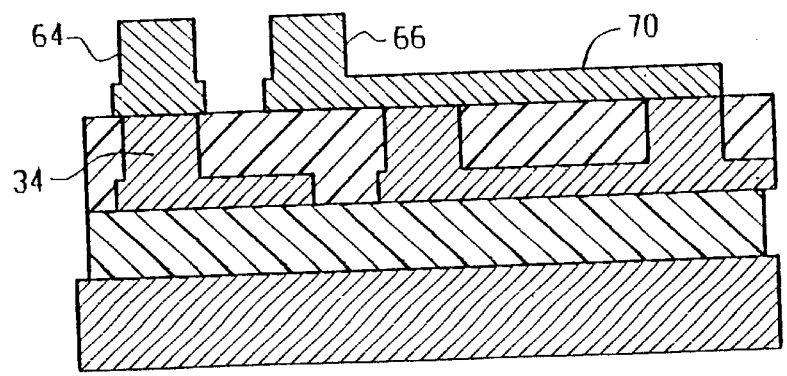

Then a second metal layer 60 is applied to the second dielectric layer 50 and the exposed top surfaces 38 and 40 of conductive bumps 34 and 36, respectively, as shown in FIG. 3(b) to provide a multi-layered structure wherein the first conductive layer is interconnected to a second conductive layer by a plurality of solid, conductive bumps. Preferably the second metal layer comprises copper. Preferably, the second metal layer is applied by plating. The second metal layer may also be applied by first plating a joining metal atop the bumps, and utilizing a dielectric that is thermoplastic, and then laminating a copper foil to the bumps and dielectric simultaneously. The appropriate metal joining metallurgy is known art (see U.S. Pat. Nos. 5,442,144 and 5,359,767). Thereafter, substantially coplanar conductive pads and electrical circuitry are subtractively formed from the second metal layer employing the steps shown in FIGS. 3(c) through 3(f). These steps are identical to steps depicted in FIGS. 1(b) through 1(e) and comprise photoimaging a first photoresist 62 that is applied to second metal layer 60, etching second metal layer to provide conductive bumps 64 and 66, photoimaging a second photoresist 68 that is applied to the second metal layer, and etching the second metal layer 60 to provide conductive line 70. The resulting product is a multilayered printed circuit board in which at least two conductive layers are interconnected by at least one solid conductive bump.

Figure 4A:
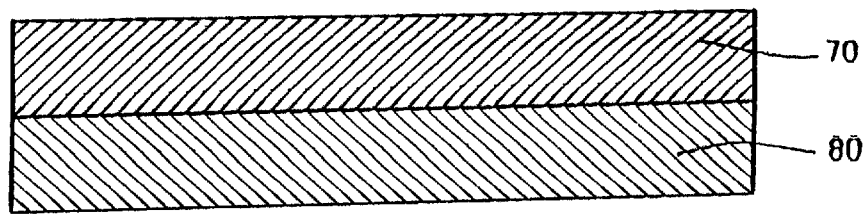
FIGS. 4(a) through 4(g) illustrate the process steps for forming a printed circuit board in which at least two conductive layers on opposing surfaces of a dielectric layer are connected by a solid conductive bump.
Figure 4B:
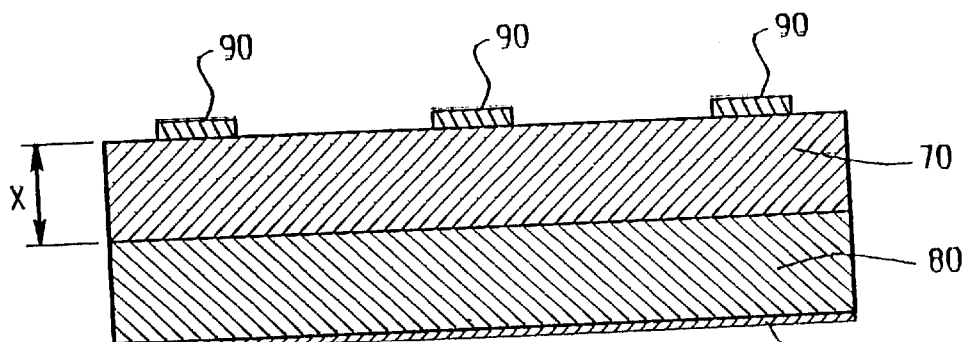
Figure 4C:
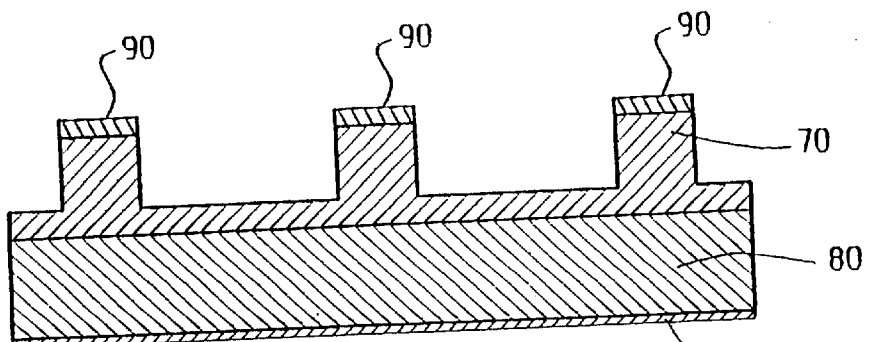
Figure 4D:
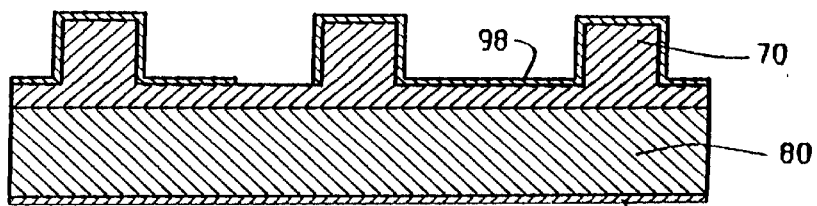
Figure 4E:
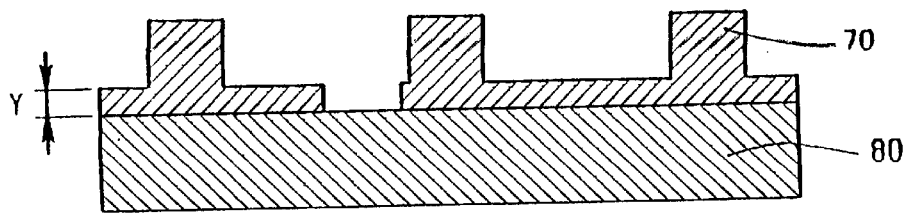
Figure 4F:
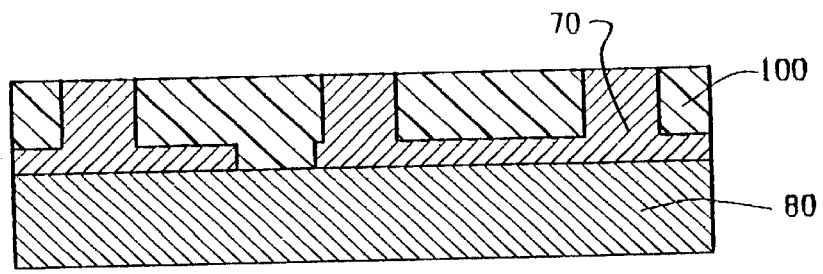
Figure 4G:
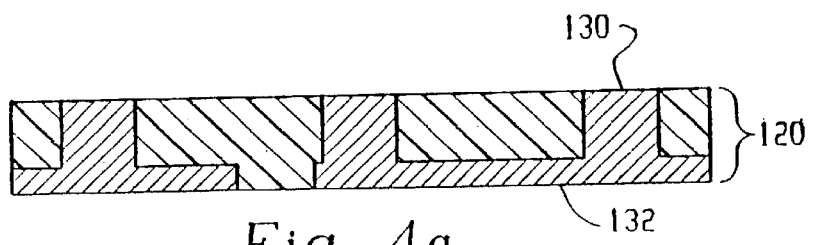

In another aspect of this invention, a method of forming solid interconnects between two conductive layers of a printed circuit board is provided. As shown in FIG. 4(a), the initial step in this method involves plating or, preferably, laminating one metal layer 70, preferably a copper layer to a second metal layer 80, which preferably is an aluminum layer. Metal layer 70 has a first height (x). Photoresists 90 and 92 are then applied to opposing surfaces 94 and 96 of both metal layers, (FIG. 4(b)). Preferably, the photoresist is a dry film photoresist, such as McDermid CFL15. Photoresist 92 is blanket exposed to protect second metal layer 80 during the processing of first metal layer 70. Photoresist 90 is photoimaged to provide a pattern of remaining photoresist sections dispersed on top of metal layer 70 as shown in FIG. 4(b). The position and shape of these sections correspond to the desired location and shape of the intended solid interconnects. The exposed portions of metal layer 70 are then partially etched to a second height (y) as shown in FIG. 4(c). Then a third photoresist 98 is applied, preferably, after the remaining sections of first photoresist 90 and second photoresist 92 are removed, onto the exposed surfaces of the intended solid interconnects and the etched surface of metal layer 70. The third photoresist 98 is then imaged to provide a pattern of remaining photoresist which corresponds to the desired pattern of solid interconnects and a desired pattern of electrical circuitry (FIG. 4(d)). The uncovered portions of metal layer 70 are then etched along the remaining resist 98 and the remaining resist 98 removed as shown in FIG. 4(e). A dielectric layer 100 is then applied to first metal layer 70 as shown in FIG. 4(f). After the dielectric is cured, second metal layer 80 is removed by chemical etching using procedures known in the art to provide core 120 as shown in FIG. 4(g). Additional conductive layers and dielectric layers can be formed on the opposing surface 130 and 132 of core 120, using the steps described in FIGS. 3(b) through 3(f).

Figure 5A:
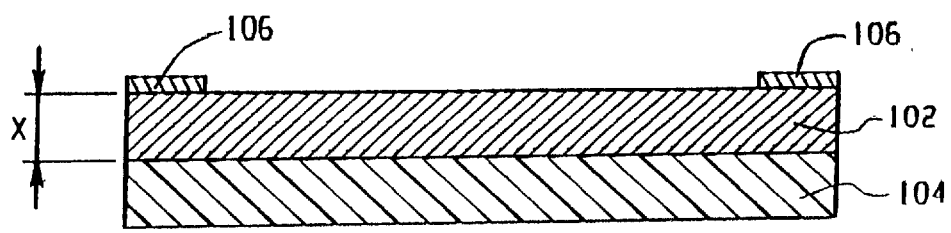
FIGS. 5(a) through 5(e) illustrate the processing steps for fabricating a metal layer that can be used to provide rigidity to the initial structures that are formed during the manufacture of flexible printed circuit boards.
Figure 5B:
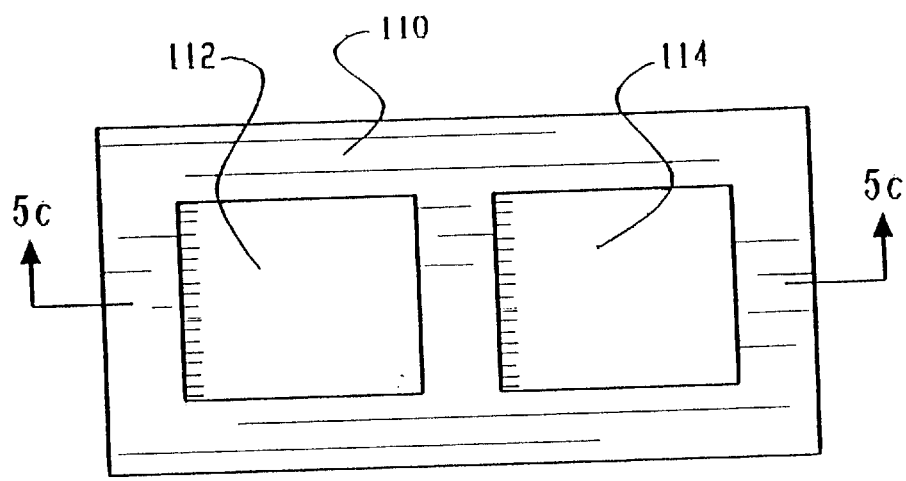
Figure 5C:
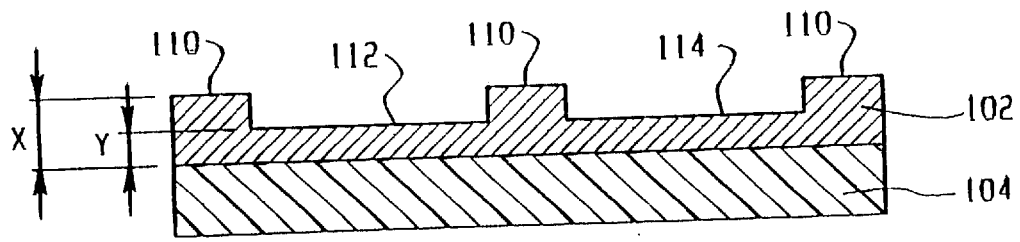
Figure 5D:
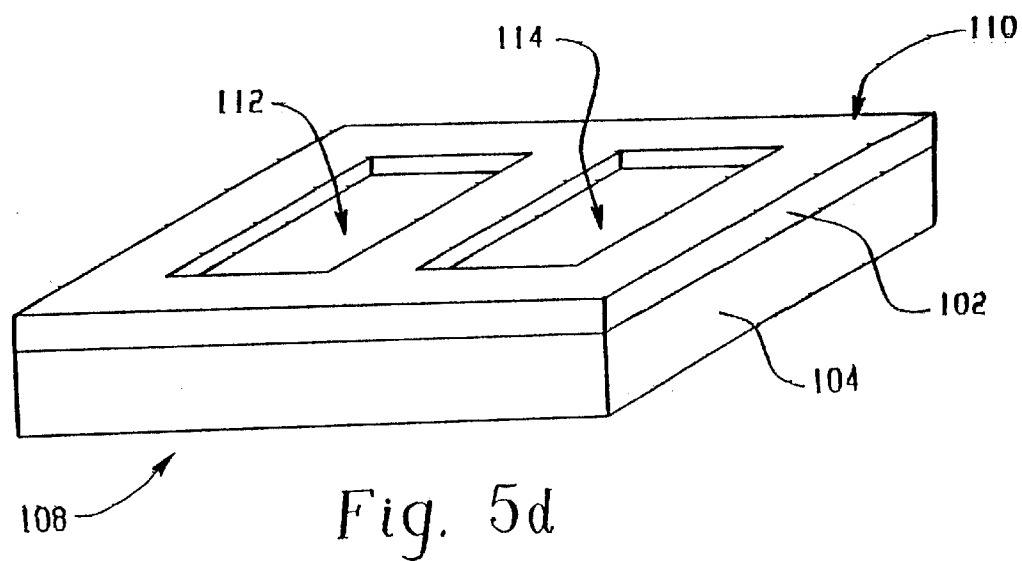
Figure 5E:
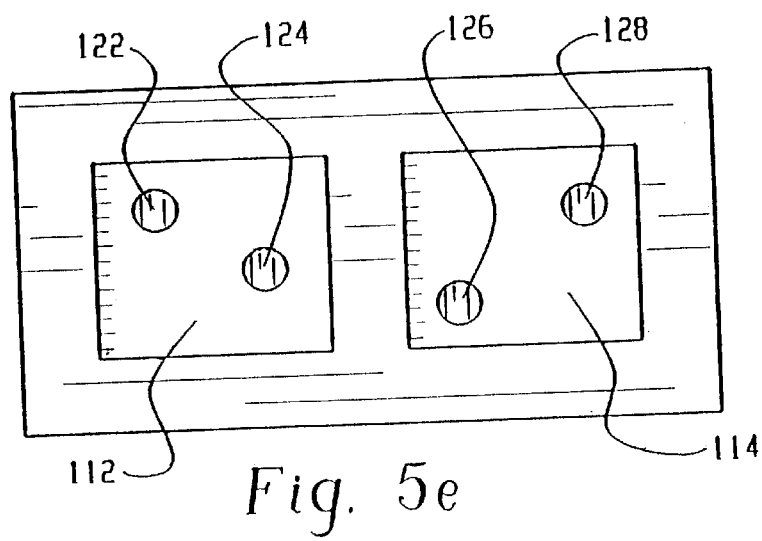

In another aspect of this invention, a method for fabricating a multi-layer structure comprising a dielectric substrate and at least one metal layer that imparts rigidity to the structures that are formed during the initial stages of manufacturing a thin or flexible printed circuit board is provided. This method involves subtractively etching a border, preferably a plurality of borders, from the metal layer that is disposed on at least one surface of the dielectric layer. Although it is possible to form the desired border before the first metal layer is applied to the first dielectric layer, it is preferred that the border be etched from the first metal layer after it is applied to the first dielectric layer. The steps of this preferred method are depicted in FIGS. 5(a) through 5(d). As shown in FIG. 5(a), a metal layer 102, preferably a substantially planar metal layer, having a first height (x) is disposed on at least one surface of dielectric substrate 104 through plating or, preferably, through lamination of a metal foil to the substrate. To provide additional reinforcement to the multi-layer structure it is preferred that two metal layers be applied to opposing surfaces of the dielectric layer. Preferably, each of the metal layers is a layer of copper, which preferably has a thickness greater than 50 $\mu$m. A first photoresist 106 is then applied to the exposed surface of metal layer 102. First photoresist 106 is imaged, i.e., exposed through a mask, and the exposed portions developed to form a pattern of remaining photoresist sections which corresponds to the desired pattern of the border, as shown in FIG. 5(a) (cross-sectional view) and FIG. 5(b) (plan view). The exposed portions of the metal layer are then partially etched to a second height (y) which is substantially equal to the desired height of the circuitry of the printed circuit board to be formed from the resulting multi-layer structure, hereinafter referred to as a "reinforced panel". Then the remaining photoresist is removed to provide a reinforced panel comprising a dielectric layer and a metal layer comprising at least two regions with different thicknesses disposed on a surface of the dielectric layer. The first region of metal having a first height (x) provides a reinforcing border to the panel. The second region of metal having a second height (y) provides a basis for forming the electrical circuitry for the printed circuit board that is fabricated from the second region. In the reinforced panel depicted in FIG. 5, border 110 is shown to cover about half of the panel, and thus provides significant amount of reinforcement. The panel depicted in FIG. 5 also comprises two regions 112 and 114 from which two printed circuit boards can be fabricated using conventional procedures. Accordingly, this reinforced panel, shown generally as 108 in FIG. 5(d) (perspective view) is well-suited for panel processing.

Alternatively, the printed circuit boards can be fabricated from the panel using the method described in example 1. In this case, the pattern of remaining photoresist would also include a plurality of patches corresponding to a desired pattern of conductive bumps disposed within openings defined by the remaining photoresist sections that overlie the intended border. To reduce undercut of the conductive bumps, it is preferred that the etching be conducted at a temperature below 110° F. The panel that would result from partially etching the exposed regions of the metal layer to a second height (y) and removing the remaining sections and patches of photoresist would further comprise a plurality of substantially coplanar conductive bumps 122, 124, 126, and 128 disposed on and continuous with the second regions of the metal layer. (FIG. 5(e)). The height of the conductive bumps and the border are substantially equal to each other.

Following fabrication of the printed circuit boards from the panel, the border region is removed and discarded. Accordingly, the instant method of reinforcing the panel does not alter the thickness or material properties of the finished printed circuit board fabricated therefrom.

While the invention has been described to some degree of particularity, various adaptations and modifications can be made without departing from the scope of the invention as defined in the appended claims.

What is claimed is:

1. A method of forming a printed circuit board comprising a plurality of conductive bumps with substantially coplanar upper surfaces, said method comprising the steps of:
   (a) applying a continuous homogenous metal layer having a substantially planar face onto a first opposing surface of a dielectric substrate;
   (b) applying a first photoresist onto said face;
   (c) exposing and developing said first photoresist to define a pattern of conductive bumps;
   (d) etching the metal layer exposed by development of said first photoresist to reduce the height of said exposed metal layer and to form said plurality of conductive bumps with a continuous homogenous structure;
   (e) removing said first photoresist;
   (f) applying a second photoresist onto the metal layer;
   (g) exposing and developing said second photoresist to define a pattern of conductive bumps and circuit lines, wherein at least one of the circuit lines is continuous with at least one of the conductive bumps;
   (h) etching the metal layer exposed by the development of said second photoresist to form a pattern of circuit lines in said metal layer, wherein at least one of the circuit lines is continuous with at least one of the conductive bumps; and
   (i) removing said second photoresist to provide a printed circuit board comprising a plurality of conductive bumps having substantially coplanar upper surfaces.

2. The method of claim 1 wherein the metal layer comprises copper.

3. The method of claim 1 wherein a metal foil is laminated to the surface of the substrate in step (a).

4. The method of claim 1 wherein etching step (d) comprises treating the exposed surface of the metal layer with an etching agent comprising cupric chloride in an aqueous hydrochloric acid solution at a temperature of less than 110° F. for a time sufficient to reduce exposed portions of the metal layer to a desired second height and to produce said conductive bumps.

5. The method of claim 4 wherein the etching agent comprises cupric ions at a concentration of from about 125 to 225 gm/liter of etching agent.

6. The method of claim 4 wherein the metal layer is treated with the etching agent at a temperature ranging from about 75° F. to 100° F.

7. The method of claim 1 wherein the second photoresist is applied by an electrodeposition process.

8. The method of claim 1 further comprising the steps of applying a second dielectric onto the circuit lines, said second dielectric having an exposed planar face which is even with or below the upper surfaces of said bumps.

9. The method of claim 1 wherein a second metal layer is applied to a second opposing face of the substrate in step (a); and further comprising the steps of forming at least one metallized hole which extends through the first metal layer, the dielectric substrate, and the second metal layer to form an electrical connection between the first metal layer and second metal layer.

10. The method of claim 1 wherein etching step (d) comprises treating exposed surface temperature etching agent.

11. The method of claim 10 wherein exposing and developing step (g) defines a pattern of conductive bumps and circuit lines with at least one bump continuous with at least one circuit line; and wherein the etching step (h) forms a pattern of circuit lines in said metal layer with at least one bump continuous with at least one circuit line.

12. The method of claim 1 wherein etching step (d) comprises forming said conductive bumps with a minimal undercut.

13. The method of claim 1 wherein etching step (d) comprises treating the exposed surface of the metal layer with an etching agent selected from the group consisting of cupric chloride, ferric chloride or sodium persulphate.

14. The method of claim 1 wherein the metal layer has a thickness ranging from about 14 microns to 105 microns.

* * * * *